US009668367B2

(12) United States Patent
Fleck et al.

(10) Patent No.: US 9,668,367 B2
(45) Date of Patent: May 30, 2017

(54) WEARABLE COMPUTING SYSTEMS

(71) Applicant: Microsoft Technology Licensing, LLC, Redmond, WA (US)

(72) Inventors: Rod G. Fleck, Bellevue, WA (US); David D. Bohn, Fort Collins, CO (US); Ben Garcia, Seattle, WA (US); Sarah L. Joers, Seattle, WA (US); Aaron P. Toney, Issaquah, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 171 days.

(21) Appl. No.: 14/172,706

(22) Filed: Feb. 4, 2014

(65) Prior Publication Data

US 2015/0223355 A1 Aug. 6, 2015

(51) Int. Cl.
*H05K 7/00* (2006.01)
*H05K 5/00* (2006.01)
*H05K 5/02* (2006.01)
*G06F 1/16* (2006.01)

(52) U.S. Cl.
CPC ............. *H05K 5/026* (2013.01); *G06F 1/163* (2013.01)

(58) Field of Classification Search
CPC ........................................................ A44C 5/00
USPC ....................................... 361/679.01–679.03
See application file for complete search history.

(56) References Cited

U.S. PATENT DOCUMENTS

| 4,847,818 A | 7/1989 | Olsen |
| 5,422,989 A | 6/1995 | Bell et al. |
| 5,822,525 A | 10/1998 | Tafoya et al. |
| 5,917,480 A | 6/1999 | Tafoya et al. |
| 6,158,884 A | 12/2000 | Lebby et al. |
| 6,182,127 B1 | 1/2001 | Cronin, III et al. |

(Continued)

FOREIGN PATENT DOCUMENTS

| DE | 102008027747 A1 | 12/2009 |
| WO | 9501024 A1 | 1/1995 |

(Continued)

OTHER PUBLICATIONS

Krumm, et al., "RightSPOT: A Novel Sense of Location for a Smart Personal Object", In Fifth International Conference on Ubiquitous Computing, Oct. 12, 2003, 8 pages.

(Continued)

*Primary Examiner* — Jerry Wu
(74) *Attorney, Agent, or Firm* — Alleman Hall Creasman & Tuttle LLP (57) ABSTRACT

One embodiment provides a computing device comprising a computing device body, a display coupled with the computing device body, a first set of computing components incorporated into the computing device body, and a securing system configured to secure the body to a wrist, the securing system comprising a plurality of detachable modular segments joined together to form a second set of computing components that is modifiable by changing segments. Each modular segment comprises a first mechanical connector and a second mechanical connector, a first set of electrical connectors and a second set of electrical connectors, and one or more electrical components incorporated into the modular segment, such that a functionality of the computing device is modifiable by changing modular segments.

9 Claims, 8 Drawing Sheets

(56) References Cited

U.S. PATENT DOCUMENTS

| | | | |
|---|---|---|---|
| 6,343,313 | B1 | 1/2002 | Salesky et al. |
| 6,704,797 | B1 | 3/2004 | Fields et al. |
| 6,760,749 | B1 | 7/2004 | Dunlap et al. |
| 7,035,899 | B2 | 4/2006 | Marchon et al. |
| 7,596,249 | B2 | 9/2009 | Bacus et al. |
| 7,618,260 | B2 | 11/2009 | Daniel et al. |
| 7,995,652 | B2 | 8/2011 | Washington |
| 8,520,002 | B2 | 8/2013 | Stambaugh |
| 8,521,816 | B2 | 8/2013 | Srinivasan et al. |
| 8,606,942 | B2 | 12/2013 | Perlman et al. |
| 2002/0012292 | A1* | 1/2002 | Mitamura ............ A44C 5/0015 368/281 |
| 2002/0021758 | A1 | 2/2002 | Chui |
| 2002/0081976 | A1 | 6/2002 | Fujisawa et al. |
| 2003/0071791 | A1 | 4/2003 | Hanson et al. |
| 2003/0110218 | A1 | 6/2003 | Stanley |
| 2003/0125097 | A1 | 7/2003 | Anlauff |
| 2003/0160814 | A1 | 8/2003 | Brown |
| 2004/0047519 | A1 | 3/2004 | Gennart et al. |
| 2004/0057578 | A1 | 3/2004 | Brewer |
| 2005/0091579 | A1 | 4/2005 | Mewherter et al. |
| 2006/0023969 | A1 | 2/2006 | Lara et al. |
| 2006/0202618 | A1 | 9/2006 | Ishii et al. |
| 2006/0291042 | A1 | 12/2006 | Alfano et al. |
| 2007/0226314 | A1 | 9/2007 | Eick et al. |
| 2007/0250506 | A1 | 10/2007 | Stevens et al. |
| 2007/0279852 | A1* | 12/2007 | Daniel ................. A44C 5/0007 361/679.03 |
| 2008/0114217 | A1 | 5/2008 | Suyama et al. |
| 2008/0223890 | A1 | 9/2008 | Tecchiolli et al. |
| 2009/0138636 | A1 | 5/2009 | Burton et al. |
| 2009/0163241 | A1 | 6/2009 | Vossoughi et al. |
| 2009/0165031 | A1 | 6/2009 | Li et al. |
| 2009/0173760 | A1 | 7/2009 | Good |
| 2009/0300528 | A1 | 12/2009 | Stambaugh |
| 2010/0166065 | A1 | 7/2010 | Perlman et al. |
| 2011/0012929 | A1 | 1/2011 | Grosz et al. |
| 2011/0014956 | A1* | 1/2011 | Lee ................. H04M 1/274525 455/569.1 |
| 2011/0231518 | A1 | 9/2011 | Srinivasan et al. |
| 2012/0027304 | A1 | 2/2012 | Brown et al. |
| 2012/0102111 | A1 | 4/2012 | Salesky et al. |
| 2012/0218442 | A1 | 8/2012 | Jandhyala et al. |
| 2013/0041617 | A1 | 2/2013 | Pease et al. |
| 2013/0057549 | A1 | 3/2013 | Beaver, III et al. |
| 2013/0069946 | A1 | 3/2013 | Venon et al. |
| 2013/0107674 | A1 | 5/2013 | Gossweiler, III et al. |
| 2013/0120106 | A1 | 5/2013 | Cauwels et al. |
| 2013/0135972 | A1* | 5/2013 | Nakamura ............ G04G 21/02 368/11 |
| 2013/0166538 | A1 | 6/2013 | Hadley et al. |
| 2014/0297799 | A1 | 10/2014 | Gordon et al. |

FOREIGN PATENT DOCUMENTS

| | | | |
|---|---|---|---|
| WO | 0038256 | A1 | 6/2000 |
| WO | 2004077338 | A2 | 9/2004 |
| WO | 2007077284 | A1 | 7/2007 |

OTHER PUBLICATIONS

Warren, Tom, "Microsoft's Xbox Team Testing Smartwatch Prototypes with a Surface Connector", Published on: Apr. 17, 2013, <<http://www.theverge.com/2013/4/17/4234294/microsoft-smartwatch-prototype-surface-connector>>, 3 pages.

Brueckner, Sophia "The Remindful Bracelet" http://mass62.media.mit.edu/wp-content/blogs.dir/16/files/sites/7/2013/05/remindfulbracelet.pdf>> May 20, 2013, 5 pages.

"Project Tickle", https://www.facebook.com/ProjectTickle?ref=stream>> Retrieved Jun. 20, 2013, 6 pages.

Conneally, Tim, "Introducing WIMM, the 1 inch Android wrist computer" <<http://betanews.com/2011/08/02/introducing-wimm-the-1-inch-android-wrist-computer/>> Jun. 2011, 6 pages.

Piltch, Avram, "WIMM One Android Watch Tested: Groundbreaking Wrist Computer Delivers" <<http://blog.laptopmag.com/wimm-one-android-watch-tested-groundbreaking-wrist-computer-delivers>> Dec. 28, 2011, 17 pages.

Mossesgel, Rico, "A Wrist Computer Concept That's Also Stylish" <<http://www.tomsguide.com/us/omni-tools-wrist-computer-holographic-watch,news-6296.html>> Mar. 30, 2010, 4 pages.

"Wearable computer" <<http://en.wikipedia.org/wiki/Wearable_computer>> Last Revised: Mar. 9, 2014, 12 pages.

Bhatia, K., "Design and Performance Analysis of a Distributed Image Space Navigator," Washington University Sever Institute of Technology Department of Computer Science, Saint Louis, MO, Aug. 1997, 64 pages.

Defanti, T. et al., "Teleimmersion and Visualization with the OptIPuter," Proceedings of the 12th International Conference on Artificial Reality and Telexistence (ICAT 2002), University of Tokyo, Japan, Dec. 3, 2002, 28 pages.

Hu, S. et al., "Use Image Streaming Technologies to Present High Resolution Images on the Internet," Proceedings of the 30th ISPRS Congress, Technical Commission IV, Istanbul, Turkey, Jul. 12, 2004, 6 pages.

Jeong, B. et al., "High-Performance Scalable Graphics Architecture for High-Resolution Displays," EVL Technical Paper, Available Online at https://www.evl.uic.edu/documents/sage-tech-paper.pdf, May 1, 2005, 8 pages.

Renambot, L. et al., "Collaborative Visualization using High-Resolution Tiled Displays," Proceedings of CHI 06: Workshop on Information Visualization and Interaction Techniques for Collaboration Across Multiple Displays, Montreal, Canada, Apr. 22, 2006, 5 pages.

Pitzalis, D. et al., "A New Concept in High Resolution Internet Image Browsing," Proceedings of ELPUB2006 Conference on Electronic Publishing, Bansko, Bulgaria, Jun. 2006, 7 pages.

Malcher, M. et al., "A Context-Aware Collaborative Presentation System for Handhelds," Simposio Brasileiro de Sistemas Colaborativos (SBSC 2008), Vila Velha, ES, Brazil, Oct. 27, 2008, 11 pages.

United States Patent and Trademark Office, Office Action Issued in U.S. Appl. No. 12/727,423, Oct. 31, 2012, 7 pages.

United States Patent and Trademark Office, Notice of Allowance Issued in U.S. Appl. No. 12/727,423, Apr. 25, 2013, 8 pages.

ISA European Patent Office, International Search Report and Written Opinion Issued in Application No. PCT/US2014/066249, Mar. 6, 2015, WIPO, 13 pages.

IPEA European Patent Office, Written Opinion of the International Preliminary Examining Authority Issued in Application No. PCT/US2014/066249, Oct. 28, 2015, WIPO, 10 pages.

IPEA European Patent Office, Written Opinion of the International Preliminary Examining Authority Issued in Application No. PCT/US2015/013629, Jan. 8, 2016, WIPO, 7 pages.

ISA European Patent Office, International Search Report and Written Opinion Issued in Application No. PCT/US2015/013629, May 12, 2015, WIPO, 12 Pages.

IPEA European Patent Office, International Preliminary Report on Patentability issued in PCT Application No. PCT/US2015/013629, Apr. 21, 2016, WIPO, 8 pages.

* cited by examiner

WEARABLE COMPUTING SYSTEMS

BACKGROUND

Advances in computing technology are allowing computing systems to be configured into smaller and smaller form factors, such as wearable devices. Some wearable computing systems may be configured to be worn on a user's wrist. Wrist computing systems may have a form factor similar to a watch, with a display incorporated in a body that is configured to be worn on a top (dorsal) surface of a wrist and a strap that secures the computing system to the wrist. Other wrist-worn computing systems may take the form of a wrist band with no distinct body and strap, but rather a bracelet-like structure that incorporates a display.

SUMMARY

Embodiments are disclosed that relate to wearable computing devices. For example, one embodiment provides a computing device comprising a computing device body, a display coupled with the computing device body, a first set of computing components incorporated into the computing device body, and a securing system configured to secure the body to a wrist, the securing system comprising a plurality of detachable modular segments joined together to form a second set of computing components that is modifiable by changing segments. Each modular segment comprises a first mechanical connector and a second mechanical connector, a first set of electrical connectors and a second set of electrical connectors, and one or more electrical components incorporated into the modular segment, such that a functionality of the computing device is modifiable by changing modular segments.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Wearable computing systems may have various design constraints not present with other types of computing systems that may complicate system design. For example, unlike a mobile phone, a wearable computing system may be secured to an associated body part during use. As such, a range of locations and angles from which a wearable computing device is viewable may be constrained by limitations of human anatomy.

For example, as mentioned above, computing systems configured to be worn on the wrist may have a form factor similar to a wristwatch, with a planar body configured to be located on a dorsal (top) surface of a wrist when secured to the user's arm, or may take the form of a bracelet-like band. In either of these cases, a user may have to move the device to easily view the display on the device, such as by raising an elbow and/or rotating a wrist to turn the display more directly toward the face.

In the case of an ordinary wristwatch, moving the watch into view may pose no inconvenience, as a user typically just quickly glances at the watch on those occasions when the user wishes to view the time. However, in the case of a wrist-worn computing system, the user may look at the display for longer periods of time, such as to view images (e.g. photos and videos), to read or compose messages, etc. Additionally, wrist computing systems also may provide notifications of incoming content, such as received text, email and/or voicemail messages. Thus, a user may make many arm movements if such notifications are received frequently.

Additionally, wearable computing system also may have size constraints compared to devices such as mobile phones. For example, it may be desirable for a wrist computing system to include all of the component functionalities of a smart phone, such as displays, touch sensors, cell phone components, motion sensors (accelerometers and gyroscopes), forward and backward facing cameras, microphones, speakers, haptic outputs (e.g. vibration motors), Wi-Fi antennas, global positioning system (GPS) sensors, logic devices (e.g. processors), mass storage, etc. However, while all of these devices may fit well within the form factor of a mobile phone, they may not fit as well in a smaller form factor, such as a watch small enough to be comfortably worn.

As one potential solution, a wrist computing device sufficiently small to be worn on the wrist may omit one or more functionalities commonly found in larger mobile devices, such as functionalities desired more by a select sub-group of targeted consumers rather than functionalities desired by a broader range of the targeted consumers. However, this may result in the loss of potential buyers.

Another possible solution may be to utilize a bracelet-style body to increase an amount of interior space available for components. However, human wrists have a broad range of sizes. Thus, a bracelet-style device may have to be manufactured in multiple sizes to fit a broad range of users. This may increase the complexity and cost of manufacturing such devices.

Accordingly, embodiments are disclosed herein that relate to wearable computing devices that may facilitate the viewing of content on the device from various angles, may simplify the fitting of wrists of a broad range of sizes, and/or may permit implementation of a broad range of user-selected functionalities in a comfortably-sized form factor, among other features. For example, some embodiments relate to a wrist computing device having a body and display that curves from a dorsal side to a lateral side of the wrist. Such a shape may permit items displayed on the display (e.g. notifications) to be viewed from natural viewing angles without having to raise and/or reorient the forearm. Further, such a shape may allow a broad range of wrist sizes to be fit with a common-sized device, unlike bracelet-style devices. The surfaces of the wrist may be referred to herein as follows: dorsal (top side), palmar (bottom side), medial (pinky side) and lateral (thumb side).

Figure 1:
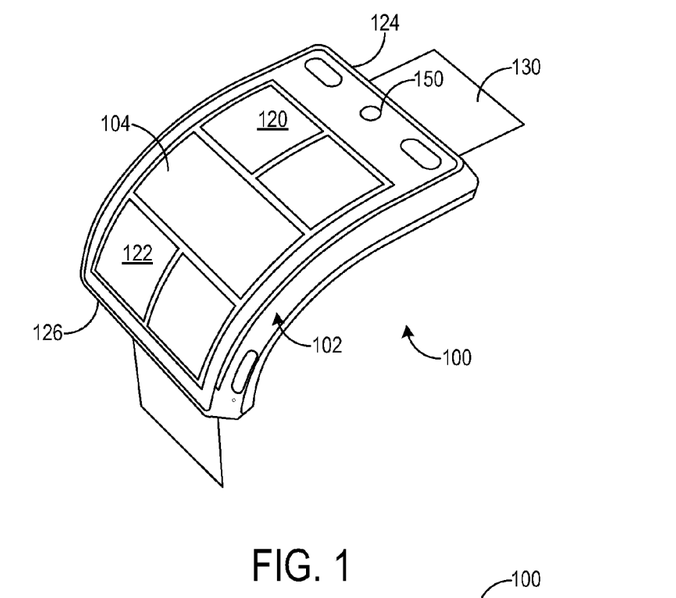
FIG. 1 shows an embodiment of a wearable computing device.
Figure 2:
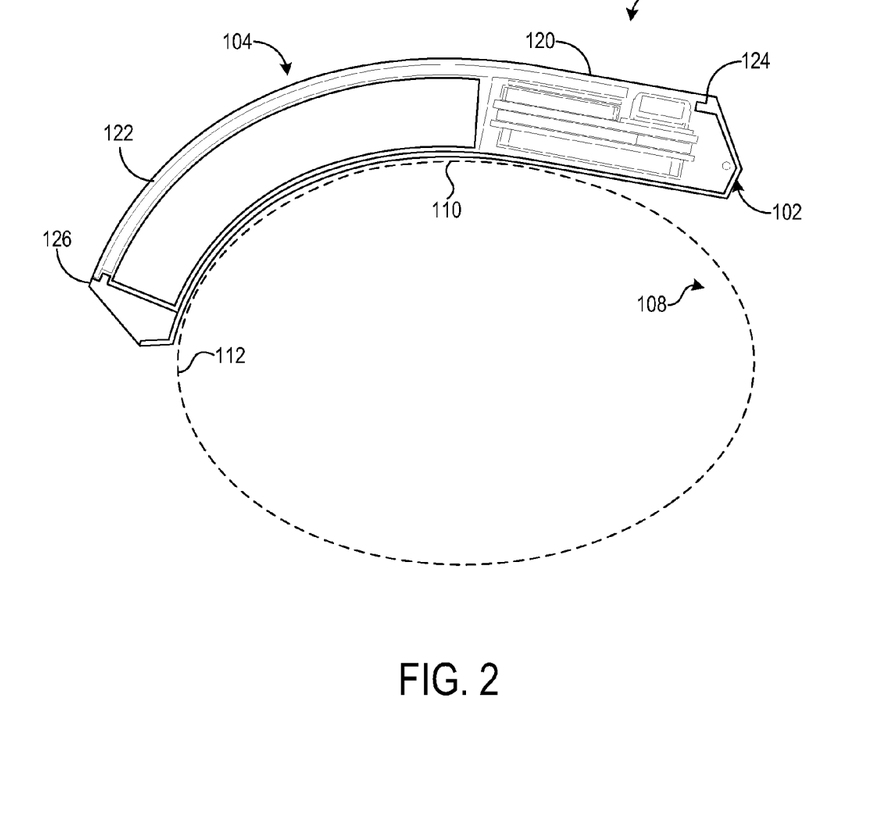
FIG. 2 shows a side sectional view of the embodiment of FIG. 1, with a schematic outline of a human wrist shown in dashed line.

FIG. 1 shows an embodiment of a wrist computing device 100 comprising a body 102 and a display 104, and FIG. 2 shows a side sectional view of the wrist computing device 100. FIG. 2 also schematically shows a human wrist 108, and illustrates a dorsal side 110 and a lateral side 112 of the wrist 108. The body 102 and display 104 of the depicted wrist computing device 100 each include a planar portion 120 and a curved portion 122. The planar portion 120 of the body extends in a planar configuration from a dorsal end 124 that is configured to be located over the dorsal side 110 of the wrist 108 partially toward a lateral end 126 configured to be located along the lateral side 112 of the wrist when the computing device is worn on a wrist. The curved portion 122 of the body extends from an end of the planar portion 120 to the lateral end 126 of body 102.

The depicted display 104 covers a substantial portion of planar portion 120 and curved portion 122 of body 102. However, it will be understood that a wrist computing device may have a display that covers any other portions of the curved and planar portions of the body than that shown. Further, in some embodiments, two or more displays may be arranged along the body in a segmented manner. The use of segmented displays may allow rigid, planar displays to be approximately fit to the curvature of body 102. The size and form factor of a wrist computing device 100 may vary depending upon an intended function of the device, screen size, and other factors. For example, a wrist computing device may be provided with smaller display (e.g. <1.6 inches) and a larger (e.g. 2 to 2.4 inches) to fit individuals of different sizes. It will be understood that these examples are intended to be illustrative and not limiting in any manner. Any suitable type of display device may be used as display 104. In the case of a curved display, examples of suitable display devices include, but are not limited to, flexible or curved OLED (organic light emitting device) displays. Further, where multiple planar displays are arranged in a segmented fashion along body 102, planar displays such as LCD (liquid crystal displays) may be used. In such embodiments, different materials (e.g. OLED and electronic ink displays) may be used in different zones of the display. For example, an electronic ink display may allow always-on operation at low power, while an OLED display may be selectively operated for full color and high refresh rates for video display.

FIG. 1 also depicts an embodiment of a securing structure 130 configured to secure the wrist computing device 100 to a human wrist. The securing structure 130 of FIG. 1 takes the form of a flexible strap, such as a watch band, that connects to the dorsal end 124 and lateral end 126 of the body 102 and that may be tightened around a wrist, but may take any other suitable form, and may or may not have a latch or buckle for connecting the securing structure around the wrist. In other embodiments, as described below, a securing structure may include built-in devices to extend the functionalities of the computing device 100.

FIG. 2 depicts the fit of the body 102 to wrist 108. As mentioned above, wrist-worn devices, such as watches and current wrist computers, may take the form of a traditional watch, with a flat display located above the dorsal side 110 of the wrist. Thus, to view the screen at a natural viewing angle, the wrist may be held in a posture that is uncomfortable to hold for more than a few minutes. Further, it may be difficult to increase the size of a flat display screen without extending far beyond the sides of a user's wrist. Some wrist worn devices may accommodate a larger display by providing a rectangular display in a landscape orientation in which a long dimension of the display extends along a user's arm. However, such a configuration may increase a width of a device to an undesirable amount. Other wrist-worn devices, such as bracelet-style devices, may have a display that extends farther around a user's wrist. However, in such an arrangement, at least a portion of the display may be occluded by the user's wrist.

In contrast, computing device 100 may accommodate a larger area screen than devices configured to be located over the lateral wrist surface alone, without extending far beyond the sides of the wrist and without the display being partially occluded by the wrist. Referring to FIG. 2, curved portion 122 of display 104 provides additional display area not available on devices that include just a planar portion configured to be located over a dorsal surface of the wrist, and accomplishes this without being excessively wide. This may help to display more content in an easier-to-view manner than wrist computing devices with smaller displays. Further, the curvature keeps body 102 from extending beyond the side of the wrist to any significant extent, as the shape of body 102 conforms to the natural curvature of the wrist. Additionally, as the body terminates along a lateral side of the wrist, the risk of a portion of the display being occluded by the user's wrist is reduced compared to displays that extend farther around the wrist, such as bracelet-style devices.

Body 102 also may fit a wider range of wrist sizes than a bracelet-style device. For example, a device having a body that extends around three or more wrist surfaces, such as a bracelet-style device, may be sensitive to the width and/or thickness of the wrist. In contrast, body 102, which extends along two sides of a wrist, is much less sensitive to wrist thickness and width. Instead, body 102 fits a curve of the wrist from the dorsal to lateral side, which may be a similar shape for wrists of many sizes. An adjustable strap or other securing structure may be used to accommodate differences in diameter and shape between different wrists. Further, display 104 may utilize less power than a display that curves around three or more sides of a user's wrist.

The configuration of body 102 also may facilitate the inclusion of a greater number of electronic components than a body 102 of similar width that is configured to be positioned over a dorsal side of a wrist but not other sides of the wrist. For example, components may be included in both planar portion 120 and curved portion 122 of body 102. Further, components may be selectively included in planar portion 120 or curved portion 122 based upon shapes for the components. For example, referring to FIG. 2, planar portion 120 may include one or more planar components such as printed circuit boards 200, 202 that support integrated circuits 204, sensor packages 206 (e.g. motion sensor(s), image sensor(s), etc.), output devices (e.g. speaker(s), haptic output(s), etc.), a SIM card, storage device(s), connector(s), biometric sensor(s), microphone(s), button(s), light emitting diode(s), and/or other components that may commonly have planar configurations. Likewise, curved portion 122 may include one or more components that may be manufactured in a curved shape, such as a battery 208, an antenna (not shown) that extends at least partially around a perimeter of body 102, and/or other components that may be more easily positioned in a curved volume. Examples include, but are not limited to, speakers and associated resonance cavities, magnetic resonance charging coils, and thin film solar cells. In addition, some planar components may fit within curved portion 122 as well. Examples include, but are not limited to, tact switches, microphones, light emitting diodes, ambient light sensors, etc. It will be understood that these components that may be respectively included in the planar and curved portions of body 102 are presented for the purpose of example, and are not intended to be limiting in any manner.

Curved portion 122 of display 104 may orient a portion of the display toward an eye of the user when the wrist and arm of the user are in a natural, relaxed posture (e.g. an arm resting on a table, a desk, a user's leg, etc. when the user is seated, a hand positioned on a keyboard when typing, etc.). Thus, a user may easily view notifications and other displayed content without having to move the device into a less comfortable position. Additionally, the configuration of display 104 may allow displayed content to face more toward the user, rather than toward others. This may help the user to discreetly view content that is potentially intended to be private.

In some embodiments, wrist computing device 100 may be configured to display content at different locations on display 104 in various contexts. As a more specific example, wrist computing device 100 may be configured to display notifications on curved portion 122 of display 104, rather than on planar portion 120, to help maintain the privacy of the notification. Then, the content underlying the notification (e.g. text message, email, text conversion of voice mail, etc.) may be revealed on a larger area of display 104 by movement of the wrist to direct the planar portion 120 of display 104 more toward an estimated position of a reference body part of the user (e.g. head, eyes) as determined from motion data.

Likewise, motion data also may be used to vary a location of content on display 104 as a user moves wrist computing device 100 relative to the estimated location of a reference body part. As a more specific example, some types of content, such as an SMS message, may not occupy an entirety of display 104. Thus, the message may be displayed on an area of display 104 determined to be likely to be facing the user, and the location of the message on the display may vary as the position of the device moves relative to an estimated location of the body part of the user. Any suitable motion sensor(s) may be used to detect motion of wrist computing device 100. Examples include, but are not limited to, accelerometers, gyroscopes, and/or image sensor(s), such as image sensor 150 of FIG. 1.

Figure 3:
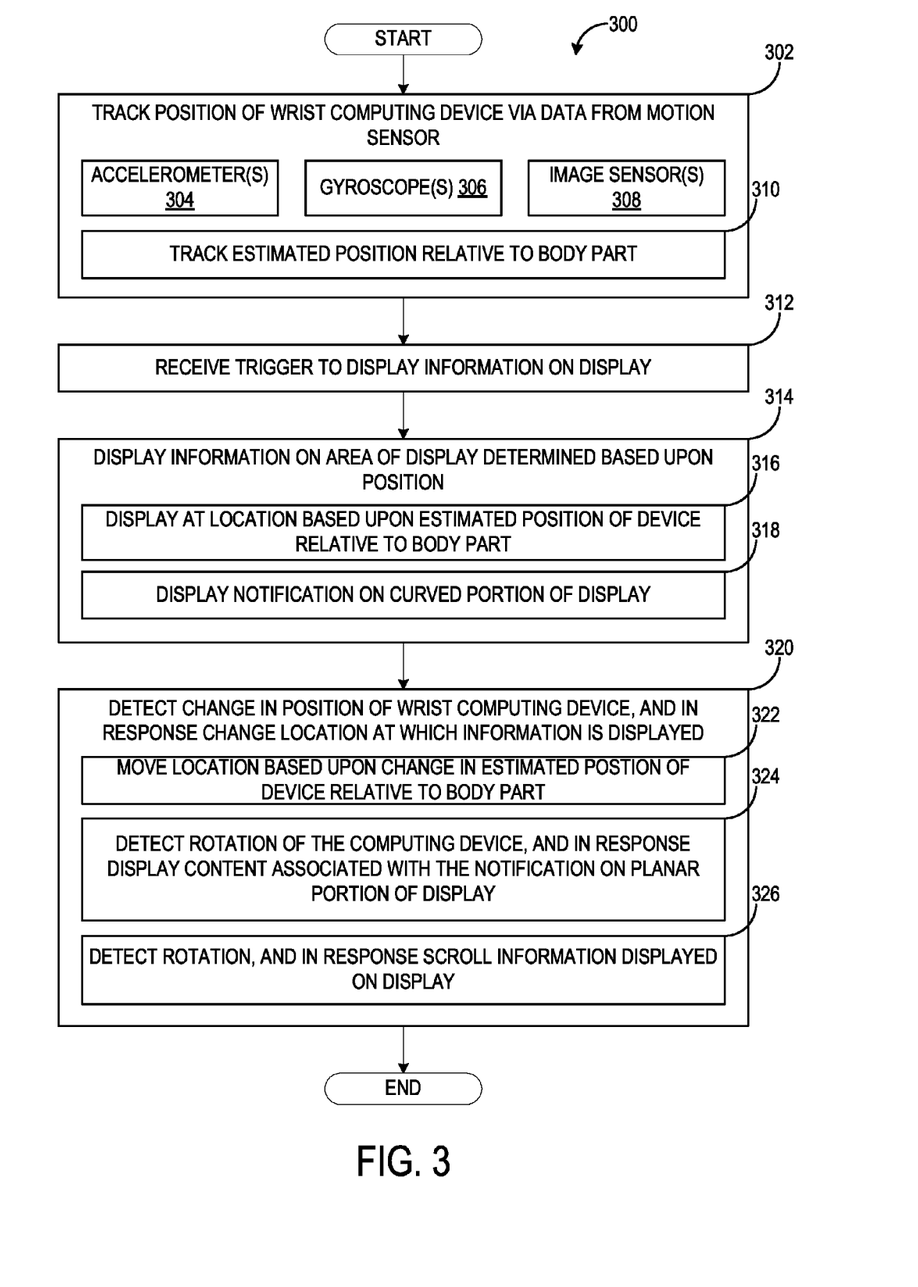
FIG. 3 shows a flow diagram depicting an embodiment of a method for operating a wearable computing device.

FIG. 3 is a flow diagram that depicts an embodiment of a method 300 for operating a wrist computing device. Method 300 may be performed, for example, via execution of computer-readable instructions stored on a wrist computing device by a logic subsystem on the wrist computing device. Method 300 comprises, at 302, tracking a position of the wrist computing device via data from the motion sensor. Any suitable type of motion data may be used. Examples include, but are not limited to, data from accelerometer(s) 304, gyroscope(s) 306, and/or image sensors 308 (e.g. two-dimensional and/or depth image sensors). The position may be tracked relative to an estimated location of a body part, such as a head or eyes, of a user, or based upon any other suitable reference location. Any suitable information regarding the estimated position of the wrist computing device may be tracked, including but not limited to wrist computing device rotation and translation information. The estimated position of the body part may be determined, for example, based upon information (e.g. data, function(s), heuristic(s), etc.) that relate a wrist posture as determined from the motion data to a body posture.

Continuing, method 300 comprises, at 312, receiving a trigger to display information on a display. Any suitable trigger may be received, and the trigger may be received from any suitable source, whether internal or external to the wrist computing device. As one example, the trigger may comprise receipt of a communication (e.g. text message, email message, voice mail message) from another device, a user input requesting display of content, a notification of an internally stored event (e.g. a calendar reminder or other user-set alert), and/or any other suitable trigger.

Figure 4A:
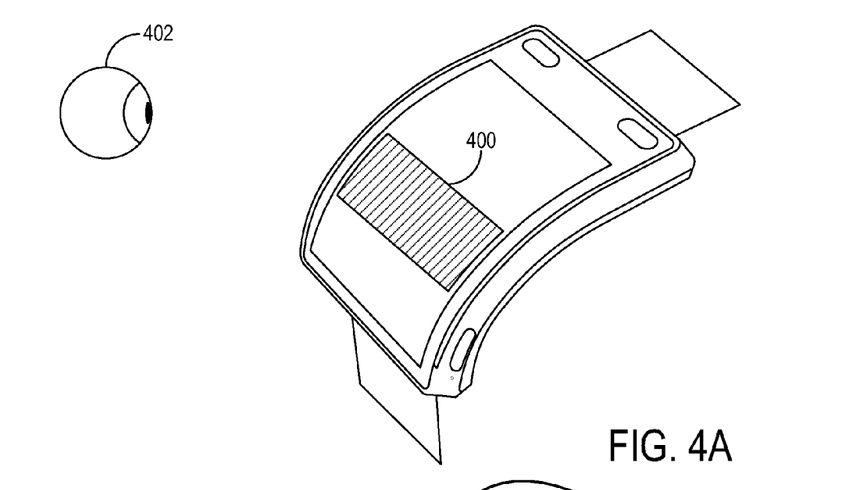
FIGS. 4A and 4B illustrate varying a location at which content is displayed on a display based upon motion of a computing device according to an embodiment of the disclosure.

In response to the trigger, method 300 comprises, at 314, displaying the information on an area of the display determined based upon the estimated position of the wrist computing device. As one example, the information may be displayed on an area of the display determined based upon an estimated position of the wrist computing device relative to a body part of the user (e.g. head, eyes), as indicated at 316. As a more specific example, a content item, such as a message, that may not occupy a full display area may be displayed at an area estimated to be approximately at a normal angle relative to a user's line of sight. FIG. 4A shows an example of this, wherein content 400 illustrated as a shaded region is displayed on a first region of display 104 that is estimated to be directed toward a user's head, as illustrated by eye 402.

Figure 5A:
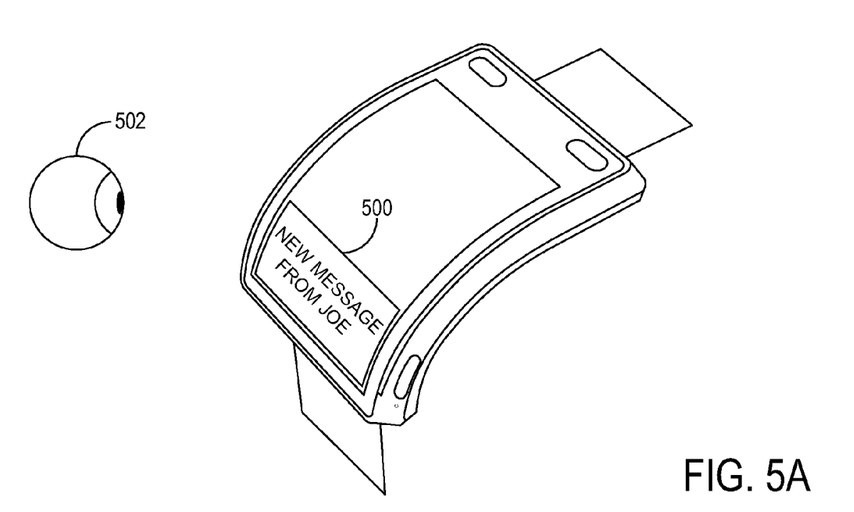
FIGS. 5A and 5B illustrate a display of a notification on a curved portion of a display, followed by display of the subject message on a different area of the display, according to an embodiment of the disclosure.

As another example, a notification may be displayed on a curved portion of a display, as indicated at 318. FIG. 5A shows an example embodiment of a notification 500 displayed on the curved portion of display 104, wherein the notification 500 comprises an alert regarding a newly received message. As illustrated, the notification 500 is displayed on an area of display 104 that may be easily viewed by a user wearing wrist computing device 100 when the user's wrist is in a natural, relaxed posture.

Figure 4B:
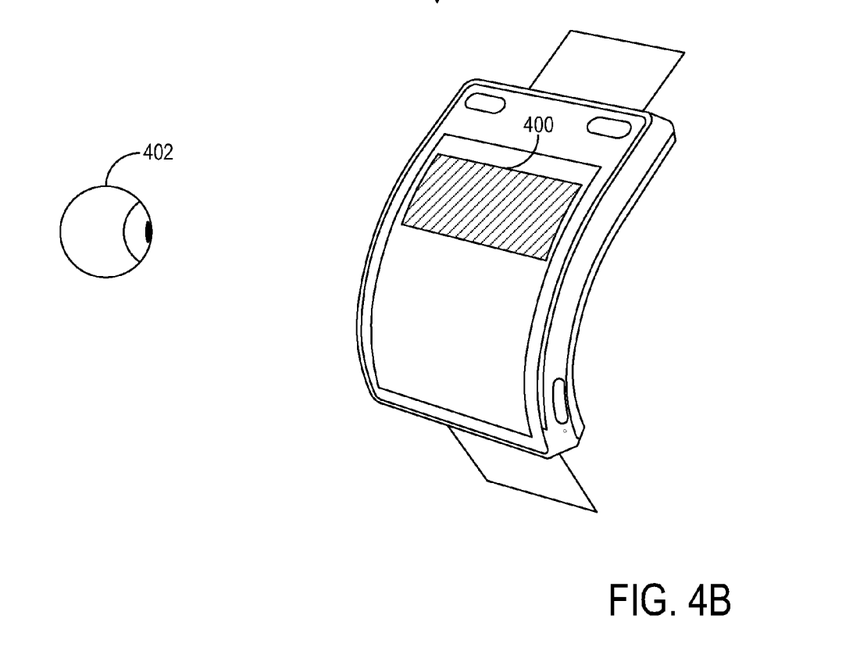

Method 300 further comprises, at 320, detecting a change in position of the wrist computing device via the tracking of the position of the wrist computing device, and in response, changing a location at which information is displayed on the wrist computing device. The location at which the information is displayed may be changed in any suitable manner. For example, if a change in the estimated location of the wrist computing device relative to the user's body part (e.g. head or eyes) is detected, then the location at which information is displayed may be changed to an area of the display determined to be oriented more toward a head of the user, and not an area of the display determined to be oriented less toward the head of the user. This is illustrated in FIG. 4B, wherein content 400 has been moved to a different area of display 104 in response to a change in an estimated position of the display 104 relative to the user's head or eye 402.

Figure 5B:
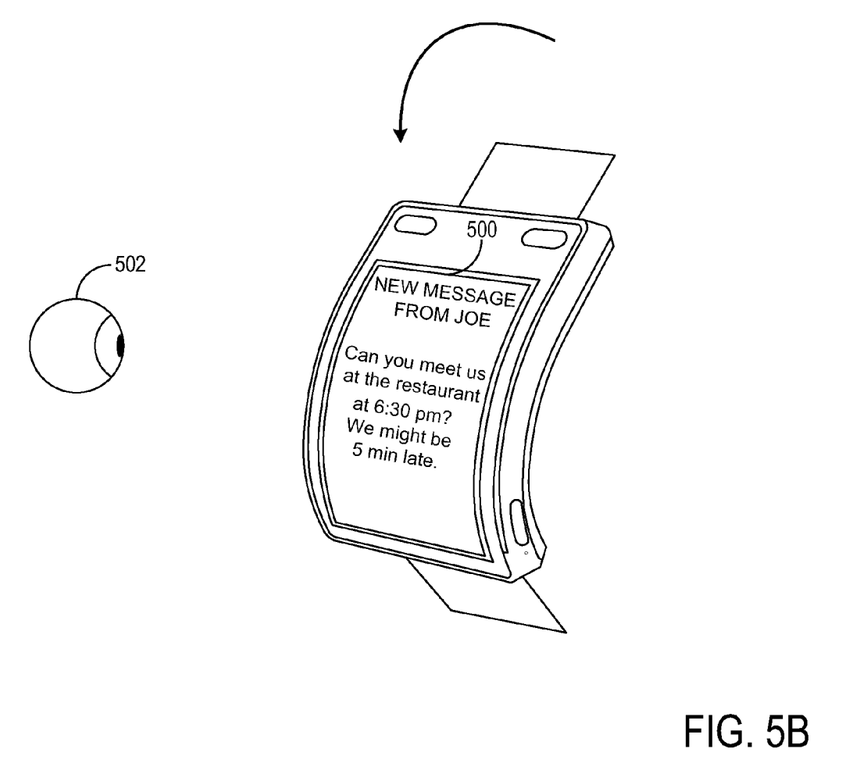

Further, where a notification is displayed, movement of the wrist computing device may be configured to trigger display of the content that is associated with (e.g. the subject of) the notification, as indicated at 324. For example, FIG. 5B shows wrist computing device 100 after a user, illustrated by eye 502, has rotated planar portion 120 of wrist computing device 100 inwardly to view planar portion 120 more directly. In response to this motion, wrist computing device 100 displays the subject message 504. In the depicted example, the entirety of display 104 is used to display the message 504, but it will be understood that, in other examples, the message 504 may be displayed on a smaller area of the display estimated to face the viewer's head or eyes relatively directly to help maintain privacy.

Continuing with FIG. 3, in the examples above, data from motion sensors is used to vary a location at which display 104 is actively displaying information. However, data from motion sensors may be used to adjust the location of displayed content in other manners. For example, wrist motions may be used to scroll information displayed on the display, as indicated at 326. As a more specific example, a wrist computing device may be configured to detect a rate of wrist rotation, and in response, scroll displayed information at a rate proportional to the rate of rotation. In this example, the location of an active area of display 104 is not adjusted, but a location of displayed information within a larger content item (e.g. a location of text within a text file) is changed. It will be understood that the above-described examples of changes made to the display of content based upon motion data are presented for the purpose of example and are not intended to be limiting in any manner.

As mentioned above, body 102 may provide additional room for components relative to wrist computing devices lacking curved portion 122, as curved portion 122 provides additional interior space for components that may be made in a curved shape. However, not all components that may be included in body 102 may be desirable to all users. For example, some users may desire biometric sensors, while other users may not care for such functionalities. As each component included in body 102 contributes to the cost of wrist computing device 100, including components that are desired by a relatively smaller subset of users may drive up the cost of the device for those who would like a lower cost device that omitted such components.

In light of such concerns, a wrist computing device may be configured such that a first set of functionalities of the device are provided via devices located within a body of the computing device, and a second set of functionalities are provided in a securing structure, such as a wrist band or strap, used to secure the wrist computing device to a user's body. Further, the securing structure may comprise a plurality of detachable modular segments joined together to form a second set of computing components. As described below, each modular segment may comprise a first mechanical connector and a second mechanical connector, a first set of electrical connectors and a second set of electrical connectors, and one or more electrical components incorporated into the modular segment, such that a functionality of the computing device is modifiable by changing modular segments. The modular segments also may be made in different colors, sizes, shapes, textures, etc., thereby allowing users to select modular segments based upon such considerations as fit, style and weight.

Figure 6:
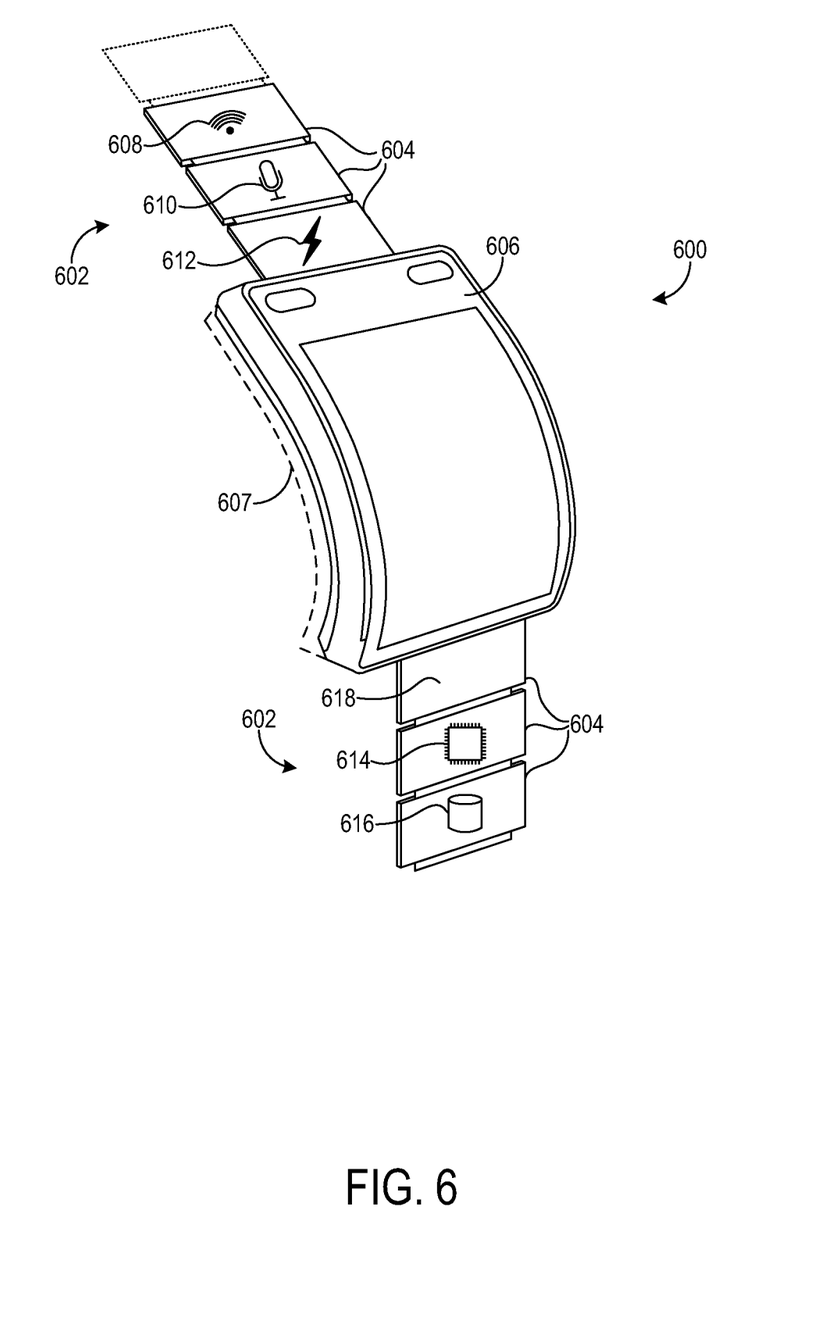
FIG. 6 shows an embodiment of a wearable computing device having a securing structure that comprises a plurality of modular segments.

FIG. 6 schematically illustrates a wearable computing device 600 having a securing structure 602 formed from a plurality of modular segments 604. While the body 606 of wearable computing device 600 is depicted as having a shape similar to that of computing device 100, it will be understood that a wrist computing device having a securing structure formed from modular segments may have a body with any other suitable shape, including but not limited to traditional planar watch shapes. Further, wearable computing devices other than wrist computing devices, such as necklace-type devices, also may utilize a securing structure with modular segments. Additionally, it will be understood that additional functionality also may be provided in a single band, rather than a modular band comprising a plurality of segments.

In some embodiments, body 606 and securing structure 602 each may be detachably mounted to a base structure 607, such that body 606 may be removed from the base structure 607 to take telephone calls, for example. In other embodiments, securing structure 602 may be directly attached to body 606. In such embodiments, a receiver and/or microphone (e.g. in the form of a headset) may be connected to body 606 wirelessly or with a wired connection to allow for comfortable use in a telephone mode.

The modular segments of securing structure 602 are illustrated schematically as comprising various components, including an antenna 608, a microphone 610, an additional power supply 612 (e.g. battery, inductive charger, kinetic charger, etc.), a sensor package 614 (e.g. biometric sensor, image sensor, ambient light sensor, motion sensor, etc.), and memory 616. Further, a segment without additional computing device functionality 618 is also illustrated. It will be understood that the components shown in FIG. 6 are depicted for the purpose of example, and are not intended to be limiting in any manner, as any suitable components may be included in modular segments.

Various factors may be considered in determining a set of functionalities to include in body 606 and functionalities to include in modular segments 604. For example, in some embodiments, it may be desirable to provide core and/or widely popular functionalities in body 606, as it is likely that most or all users will desire such functionalities. Examples of such functionalities may include, but are not limited to, core computing device components (e.g. logic and storage subsystems), wireless networking components, mobile phone components (including but not limited to circuitry, antennas, and input/output devices such as microphones and speakers), display components, touch sensor components, image sensor(s), hardware buttons and/or other hardware input devices, one or more batteries, battery charging components (e.g. wired receptacle and/or wireless charging coil), connectors (e.g. USB, 3.5 mm headphone jack), haptics, etc. It will be understood that a set of components selected for inclusion in body 606 may be selected based upon an intended use of wearable computing device 600 (e.g. whether the device is intended for use as a smart mobile device, an activity monitor, etc.).

Likewise, in some embodiments, components that are wanted by a smaller subset of users may be provided as modular segments 604 for optional use in securing structure 602. This may allow each individual user to select a set of functionalities desired by that user, thereby allowing customization of the computing capabilities of wearable computing device 600. Any suitable set of functionalities may be provided as modular segments 604. Examples include, but are not limited to, camera(s) (e.g. high resolution and/or rear facing), one or more extra batteries, an auxiliary display (e.g. an OLED or electronic ink display), one or more speaker(s), passive power collection features (e.g. solar and/or kinetic), wireless charging features, one or more sensors (e.g. GPS sensor, motion sensor, ambient light sensor, biometric sensor such as temperature, pulse, oxygen saturation sensors, blood sugar sensor, spirometer, etc.), wireless networking capabilities (e.g. Ant+, ZigBee, NFC, etc.), audio jack(s), infrared emitter(s) (e.g. an IR blaster) including but not limited to light emitting diodes, depth/distance detectors (e.g. utilizing infrared/ultrasound/camera based solutions), eye detecting cameras, mass storage (e.g. board-mounted and/or SDIO card slot based), haptic output devices, visible light emitter(s) (e.g. a camera flash) including but not limited to light emitting diode(s), a SIM card, a storage device, a connector, a microphone, button(s), etc. Where a camera is incorporated into a modular segment 604, the camera may be either a primary or secondary camera for wearable computing device 600.

The use of one or more extra batteries incorporated into securing structure 602 via one or more modular segments 604, may help to increase an amount of runtime between battery charging cycles. Further, providing batteries in both body 606 and securing structure 602 may allow power to be routed in either direction (e.g. from the body to the securing structure, and vice versa), depending upon power needs.

It will be understood that the above listed components are presented for the purpose of example and are not intended to be limiting, as any other suitable components may be included in a modular segment 604 for a securing structure. For example, a modular securing structure segment may comprise haptic features that may be used to notify a user of various events, communication, and the like. Such a haptic output device may be configured to output vibration, light, and/or heat, or may perform more complex outputs (e.g. a virtual hug/squeeze performed via a structure such as an electro-polymer film, electro-fluidic device, or electro-mechanical device).

Modular segments 604 may be electrically and mechanically connected to one another and to body 606 or base structure 607 in any suitable manner. Regarding mechanical connections, and as illustrated in the sectional view of FIG. 7A (depicted from a viewing direction along the plane of the page), in some embodiments a modular segment 604 may comprise a first mechanical connector in the form of a retainer 700, such as a hook, on one side and a second, complementary mechanical connector in the form of a complementary feature 702, such as a complementary bar or pin, on another side. In such embodiments, the retainer 700 on one modular segment is configured to removably attach to the complementary feature 702 on an adjacent modular segment. It will be understood that body 606, or base structure 607 that supports body 606, may have similar mechanical connectors to allow modular segments to attach to the body or base.

Figure 7A:
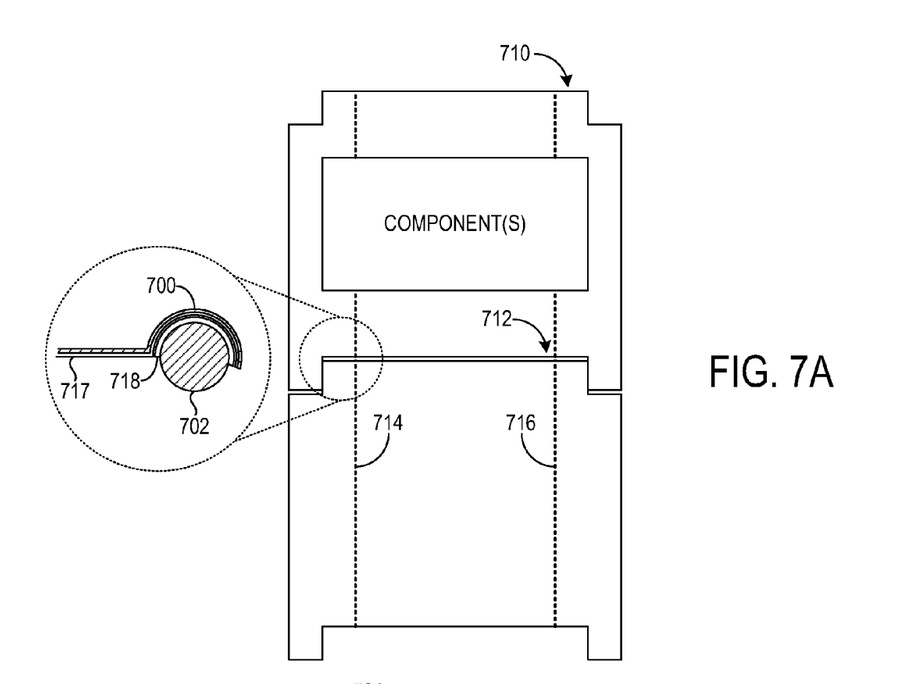
FIG. 7A schematically shows one embodiment of an electrical configuration for the modular segments of the embodiment of FIG. 6.

It will be understood that any other suitable mechanical connectors may be used other than those described above, such as spring-loaded pin assemblies similar to those that are used to connect watchstraps to watches. Such an assembly may include a first pin segment positioned within an interior of a hollow second pin segment, and a spring located within the hollow second pin segment that biases the first pin segment outwardly. In such an embodiment, the pin may be configured to carry data different electrical signals on the first and second pin segments. For example, each pin segment may include an electrical connector at an end of the segment insulated from a remainder of the segment via an insulating band, and complementary connectors in the form of receptacles for the pin ends may be provided on an opposite side of the modular segment as the pin assembly to allow the assemblies to be connected together. Such features may be utilized with pin 702, or with any other suitable connecting pin.

As a more specific example, such a pin connector may be configured to have four electrical contacts (power, ground, and a signal pair) by carrying two signals coaxially on each of two pin segments. Such a configuration may be suitable for use with protocols such as USB that utilize four electrical contacts. One-wire and/or two-wire communication standards also may be used (e.g. UART, I2C, SPI). As a more specific example, if chassis ground is used for two modules that are connected, then two ends of a pin connector may be used to connect power and also provide for a one wire communication standard. Further, connections between modular segments 604 and/or body 606 also may utilize standard electrical connections, such as universal serial bus (USB) connectors.

Figure 7B:
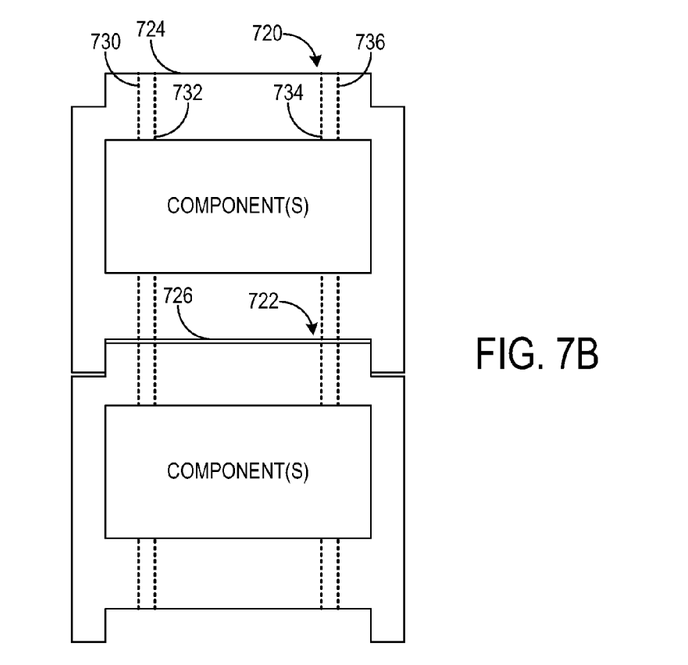
FIG. 7B schematically shows another embodiment of an electrical configuration for the modular segments of the embodiment of FIG. 6.

Regarding electrical connections, in some embodiments each modular segment 604 may have a first set of electrical connectors that connect to an adjacent modular segment 604 (or body 606 or base for body) on one side of the modular segment, and a second set of electrical connectors that connect to an adjacent modular segment on an opposite side of the modular segment. FIGS. 7A and 7B show two example configurations of first and second sets of electrical connectors, shown schematically at 710 and 712. First referring to FIG. 7A, each modular segment has two electrical lines 714, 716 that connect to adjacent modular segments. The connections may be formed, for example, as contacts 717 that touch complementary contacts 718 on an adjacent modular segment when the modular segments are joined together by the mechanical connectors. In other embodiments, any other suitable connector, whether standard or custom, may be used. For example, some embodiments may use flex connectors that extend through hinges (e.g. a flat cable extending between segments that can flex at hinges between segments). Further, other embodiments may have any suitable number of connectors between segments.

In the embodiment of FIG. 7A, power and data signals may be carried between modular segments via the two lines 714, 716. For example, one line 714 may correspond to a ground line, while another line 716 may be configured to carry signals via modulation of a voltage on line 716, and also to provide power, for example, as the average of the modulated signal. Alternatively or additionally, one or more modular segments may communicate with other wireless segments and/or with components in body 606 wirelessly, for example, via Bluetooth, Near Field Communication (NFC), and/or in any other suitable manner. The example of FIG. 7A depicts one modular segment 604A that lacks electrical component(s). Modular segment 604A thus may represent a modular segment used for sizing purposes, as a user may not desire functionality on each modular segment used to extend fully around a user's wrist. In modular segment 604A, the conductors extending between the first set of electrical connectors and the second set of electrical connectors may themselves be considered electrical components.

FIG. 7B shows another example embodiment of first and second sets of electrical connectors 720, 722, wherein first set of electrical connectors 720 is located on a first side 724 of modular segment 604, and wherein second set of electrical connectors 722 is located on a second side of modular segment 604. In the embodiment of FIG. 7B four electrical lines are provided for each modular segment 604, which may represent a power supply line 730 (e.g. $V^{++}$), a first data line (e.g. $D^+$) 732, a second data line (e.g. $D^-$) 734, and a ground line 736. Thus, each set of electrical connectors 720, 722 comprises four connections to corresponding lines on an adjacent modular segment.

Any suitable protocol may be used to transmit data between the electrical components in modular segments 604 and the components in body 606. As one example, in the embodiment of FIG. 7B, universal serial bus (USB) protocols may be used to transmit data between components in modular segments and components in body 606, as well as to discover and recognize newly attached segments. Other examples include, but are not limited to, other wired protocols like universal asynchronous receiver/transmitter (UART), as well as wireless protocols such as BlueTooth, Wireless USB, WiFi, etc. Such protocols may allow a combination of control, data collection, audio/video data (e.g. from a camera incorporated into a modular segment), and the like to be communicated in either direction between components in body 606 and components in modular segments 604. In any case, the use of modular segments 604 may allow a functionality of wearable computing system 600 to be changed simply by detaching one or more modular segments and/or attaching one or more other modular segments.

In some embodiments, a securing structure and body portion of a wearable computing device may be configured to each function independently of the other, and also function together in cooperation. In such an embodiment, each of these structures may comprise its own power supply, and also may comprise wireless or wired connectivity capability that can connect to other devices (e.g. via a personal area network), such as mobile phones, laptop computers, other wearable devices, and the like. For example, a securing structure may contain independent functionality similar to an activity-tracking device, while the body may independently function as a smart communication device. When operated together, the securing structure may add sensing capability to the body portion of the device, and the body portion of the device may provide for a richer interface and display for the functionalities offered by the securing structure.

Figure 8:
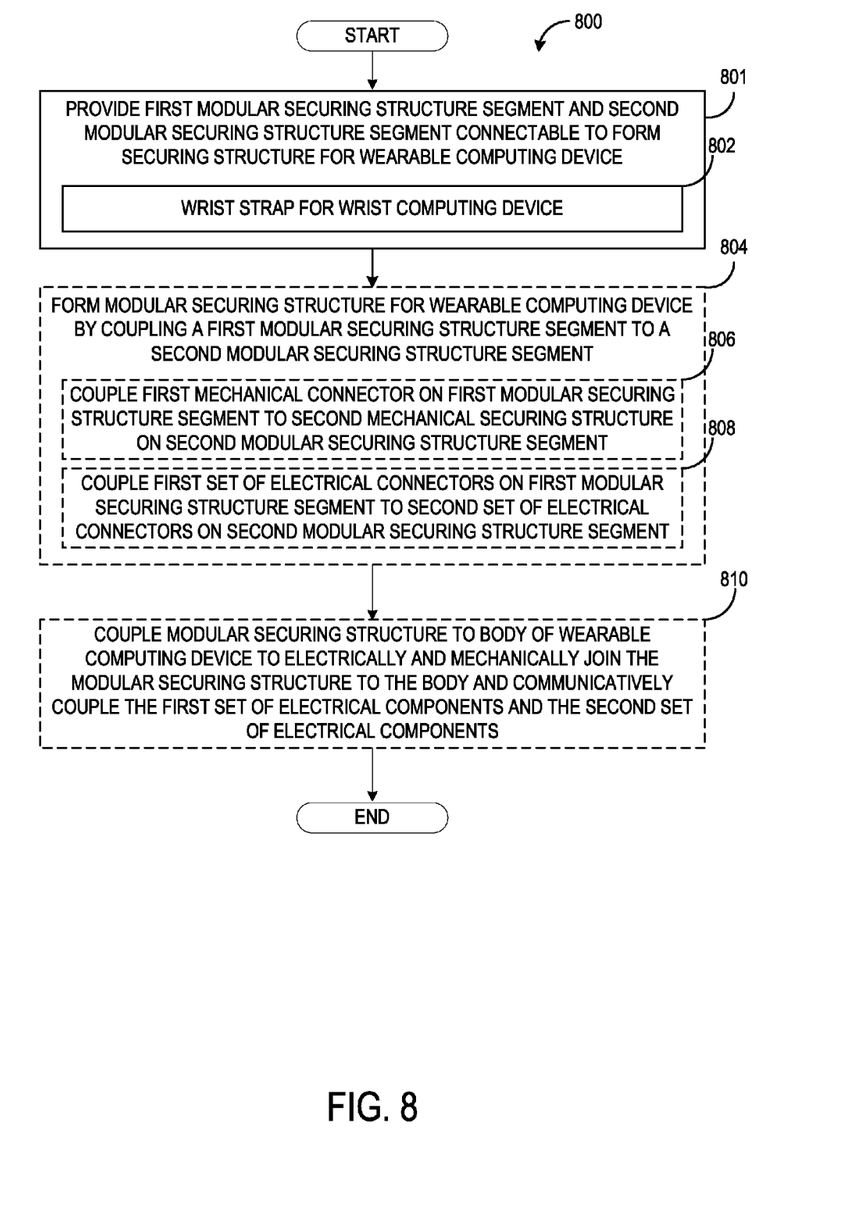
FIG. 8 shows a flow diagram depicting an embodiment of a method for operating a wearable computing device having a securing structure comprising modular segments.

FIG. 8 is a flow diagram depicting an embodiment of a method 800 of configuring a wearable computing device the wearable computing device comprising a first set of electrical components in a computing device body and a second, user-modifiable set of electrical components in a modular securing structure. In some embodiments, the wearable computing device may take the form of a wrist computing device, and the securing structure may take the form of a wrist strap or band that holds the device to the wrist, while in other embodiments the wearable computing device may take any other suitable form (e.g. necklace, other).

Method 800 comprises, at 801, providing a first modular securing structure segment and a second modular securing structure segment that are connectable to form at least a part of a modular securing structure for a wearable computing device. As indicated at 802, the securing structure may comprise forming a wrist strap for a wrist computing device in some embodiments. It will be understood that any additional number of modular securing structure segments may be provided. Further, it will be understood that the first and second modular securing structure segments may be provided either together or separately, such that a consumer may purchase the modular securing structure segments as a set or as individual units. Further, the modular securing structure segments may be provided with a computing device body (e.g. a wrist computing device body or other wearable computing device body), or separately from the computing device body.

In some embodiments, for example, where a modular securing structure is assembled prior to provision to consumers, method 800 may optionally comprise, at 804, forming the modular securing structure for the wearable computing device by coupling the first modular securing structure segment to the second modular securing structure segment. In other embodiment, such processes may be performed by end users separately from the provision of the modular securing segments.

Forming the modular securing structure may comprise, at 806, coupling a first mechanical connector on the first modular securing structure segment to a second mechanical connector on the second modular securing structure segment. Further, forming the modular securing structure also may comprise, at 808, coupling a first set of electrical connectors on the first modular securing structure segment to a second set of electrical connectors on a second modular securing structure segment.

The first and second segments may be coupled together in any suitable manner. For example, in some embodiments, a hook or other retaining feature may be mechanically attached to a complementary structure, such as a bar. As another example, a spring-loaded pin may be used to connect the two segments together. In either case, the first set of electrical connectors may be formed in such a manner as to connect automatically to the second set of electrical connectors when the first and second segments are mechanically joined together. As yet another example, the mechanical connectors each may comprise one or more magnets to hold modular segments together mechanically via magnetic attraction. The term "mechanical connector" includes any connector utilizing any connecting mechanism that allows one modular segment to be connected to an adjacent modular segment and/or computing device. Additional modular securing structure segments may be connected in a similar manner to form the modular securing structure. It will be understood that the segments joined together to form the modular securing structure may comprise any suitable functionalities, including but not limited to those described earlier herein.

Continuing, at 810, method 800 comprises coupling the modular securing structure to a body of the wearable computing device to electrically and mechanically join the modular securing structure to the body, and to communicatively couple the first set of electrical components and the second set of electrical components. The mechanical, electrical, and communicative coupling of the modular securing structure thereby to form the wearable computing device.

As mentioned above, the use of the modular securing structure may allow the functionality of the wearable computing device to be changed by removal and/or addition of modular securing structure segments. Thus, a method may further include changing a functionality of the wearable computing device by removing a modular segment and/or adding a new modular segment. In this manner, a hardware configuration and functionality of a wrist computing device may be varied simply by changing a set of modular securing structure segments used to form the securing structure for the wearable computing device. Further, a manufacturer may provide various pre-selected configurations and/or multiple boxed items with different capabilities.

In some embodiments, the methods and processes described herein may be tied to a computing system of one or more computing devices. In particular, such methods and processes may be implemented as a computer-application program or service, an application-programming interface (API), a library, and/or other computer-program product.

Figure 9:
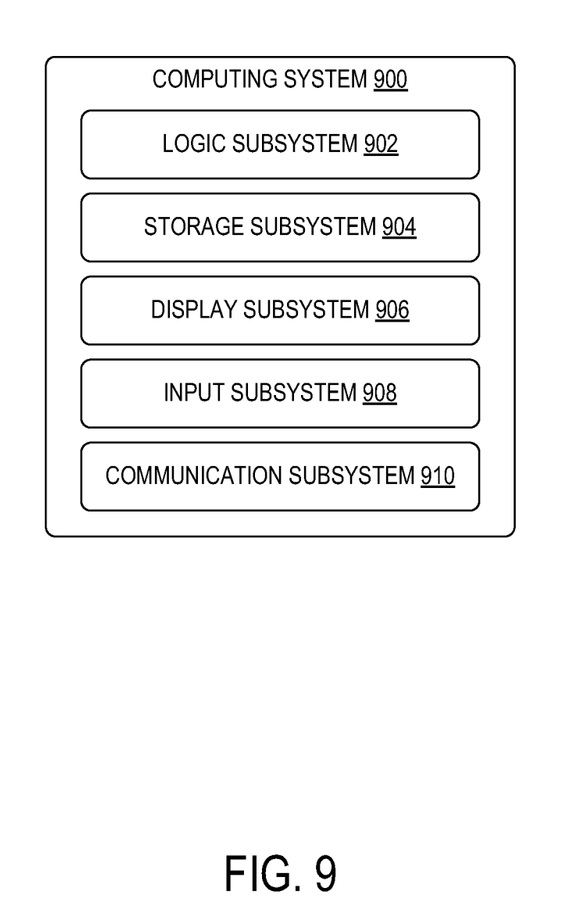
FIG. 9 shows a block diagram of an embodiment of a computing system.

FIG. 9 schematically shows a block diagram of a non-limiting embodiment of a computing system 900 that can enact one or more of the methods and processes described above. Computing system 900 is shown in simplified form. Computing system 900 may take the form of one or more personal computers, server computers, tablet computers, home-entertainment computers, network computing devices, gaming devices, mobile computing devices, mobile communication devices (e.g., smart phone), and/or other computing devices.

Computing system 900 includes a logic machine 902 and a storage machine 904. Computing system 900 may optionally include a display subsystem 906, input subsystem 908, communication subsystem 910, and/or other components not shown in FIG. 9.

Logic machine 902 includes one or more physical devices configured to execute instructions. For example, the logic machine may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine may include one or more processors configured to execute software instructions. Additionally or alternatively, the logic machine may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

Storage machine 904 includes one or more physical devices configured to hold instructions executable by the logic machine to implement the methods and processes described herein. When such methods and processes are implemented, the state of storage machine 904 may be transformed—e.g., to hold different data.

Storage machine 904 may include removable and/or built-in devices. Storage machine 904 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 904 may include volatile, nonvolatile, dynamic, static, read/write, read-only, random-access, sequential-access, location-addressable, file-addressable, and/or content-addressable devices.

It will be appreciated that storage machine 904 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 902 and storage machine 904 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

It will be appreciated that a "service", as used herein, is an application program executable across multiple user sessions. A service may be available to one or more system components, programs, and/or other services. In some implementations, a service may run on one or more server-computing devices.

Display subsystem 906 may be used to present a visual representation of data held by storage machine 904. This visual representation may take the form of a graphical user interface (GUI). As the herein described methods and processes change the data held by the storage machine, and thus transform the state of the storage machine, the state of display subsystem 906 may likewise be transformed to visually represent changes in the underlying data. Display subsystem 906 may include one or more display devices utilizing virtually any type of technology. Such display devices may be combined with logic machine 902 and/or storage machine 904 in a shared enclosure, or such display devices may be peripheral display devices.

Input subsystem 908 may comprise or interface with one or more user-input devices, such as a touch screen, hardware button, or other input mechanism. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, magnetometer, and/or gyroscope for motion detection and/or intent recognition; electric-field sensing componentry for assessing brain activity and/or body motion. Further, input subsystem 908 also may include one or more biometric sensors.

Communication subsystem 910 may be configured to communicatively couple computing system 900 with one or more other computing devices. Communication subsystem 910 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 900 to send and/or receive messages to and/or from other devices via a network such as the Internet.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A computing device configured to be worn on a user's body, the computing device comprising:
  a computing device body;

a display coupled with the computing device body;

a first set of computing components incorporated into the computing device body;

and a securing system configured to secure the computing device body in a closed loop around a wrist, the securing system comprising a plurality of detachable modular segments joined together to form a second set of computing components, each detachable modular segment comprising a first mechanical connector and a second mechanical connector each configured to be coupled to a complementary mechanical connector by using a recess to receive a pin on one or more of an adjacent modular detachable segment and the computing device body, a first set of electrical connectors and a second set of electrical connectors each configured to connect to a corresponding set of electrical connectors on the one or more of the adjacent modular detachable segment and the computing device body, one or more electrical connectors of the first set of electrical connectors comprising a first contact and being integrated with the recess of the first mechanical connector and one or more electrical connectors of the second set of electrical connectors comprising a second contact and being integrated with the pin of the second mechanical connector, such that the first mechanical connector and the second mechanical connector connect the detachable modular segment electrically and mechanically to the one or more of the adjacent detachable modular segment and the computing device body, and one or more electrical components incorporated into the detachable modular segment, such that a functionality of the computing device is modifiable by detaching one or more detachable modular segments and also by attaching one or more other detachable modular segments, wherein the plurality of detachable modular segments are configured to form an electrical circuit extending around the closed loop when attached around a wrist.

2. The computing device of claim 1, wherein the computing device is configured to be worn on a wrist, and wherein the securing system is configured to secure the computing device to a wrist.

3. The computing device of claim 1, wherein the first set of electrical connectors and the second set of electrical connectors each comprises two or more connectors.

4. The computing device of claim 1, wherein each detachable modular segment comprises a modular segment body, wherein the first set of electrical connectors and first mechanical connector are located on a first side of the modular segment body, and wherein the second set of electrical connectors and second mechanical connector are located on a second side of the modular segment body.

5. The computing device of claim 1, wherein the second set of computing components comprises one or more of an auxiliary display, a battery, a speaker, a solar power source, a kinetic power source, a solar power collector, a global positioning system sensor, an auxiliary display, a wireless battery charger, a haptic output device, a motion sensor, a camera, a SIM card, a storage device, a connector, a biometric sensor, a microphone, a button, a light emitting diode.

6. The computing device of claim 1, wherein the second set of computing components includes a plurality of detachable modular segments each comprising one or more batteries.

7. The computing device of claim 1, wherein the first mechanical connector and the second mechanical connector respectively comprise a pin and a retainer configured to connect to the pin.

8. The computing device of claim 1, wherein the first mechanical connector and the second mechanical connector each comprises one or more magnets.

9. The computing device of claim 1, wherein one or more detachable modular segments comprise electrical components in the form of conductors extending between the first set of electrical connectors and the second set of electrical connectors.

* * * * *